United States Patent [19]
Christie et al.

[11] 4,017,888
[45] Apr. 12, 1977

[54] NON-VOLATILE METAL NITRIDE OXIDE SEMICONDUCTOR DEVICE

[75] Inventors: Kenneth Howard Christie, Hopewell Junction, N.Y.; David DeWitt, Los Gatos, Calif.; William Stanford Johnson, Hopewell Junction, N.Y.

[73] Assignee: International Business Machines Corporation, Armonk, N.Y.

[22] Filed: Dec. 31, 1975

[21] Appl. No.: 645,770

[52] U.S. Cl. .................................. 357/54; 357/23; 357/52; 357/37; 357/91
[51] Int. Cl.² ............... H01L 29/34; H01L 29/78; H01L 29/00; G11B 13/00
[58] Field of Search ............... 357/23, 34, 35, 38, 357/50, 52, 37, 54, 56, 91; 340/173

[56] References Cited

UNITED STATES PATENTS

| | | | |
|---|---|---|---|
| 3,867,204 | 2/1975 | Rutledge | 357/23 |
| 3,875,567 | 4/1975 | Yamazaki et al. | 357/23 |
| 3,891,468 | 6/1975 | Ito et al. | 357/91 |
| 3,943,542 | 3/1976 | Ho et al. | 357/23 |

OTHER PUBLICATIONS

IBM Technical Disclosure Bulletin; *Built–in Channel FET*, by Chang, vol. 14, No. 4 Sept. 1971 pp. 1279 and 1280.
IBM Technical Disclosure Bulletin; *Short Channel Field-Effect Transistor*; by Abbas et al.; vol. 17, No. 11 Apr. 1975 p. 3263.

*Primary Examiner*—Andrew J. James
*Attorney, Agent, or Firm*—James M. Thomson

[57] ABSTRACT

A metal nitride oxide semiconductor device capable of use within a memory cell, having a more heavily doped region of the same type as the substrate provided directly under the channel of the depletion mode device. Application of a positive write voltage to the gate of the device, with the substrate at 0 volts potential and the source and drain biased to a suitable positive level, results in avalanche operation of the device whereby charge is stored in a nitride oxide interface under the gate, thereby converting the device to enhancement mode operation. The charge can be removed with the source and drain biased to the 0 volt potential of the substrate and a positive erase signal applied to the gate. A four device memory cell is disclosed.

5 Claims, 2 Drawing Figures

NON-VOLATILE METAL NITRIDE OXIDE SEMICONDUCTOR DEVICE

BACKGROUND OF THE INVENTION

1. Field of the Invention

The present invention concerns a metal nitride oxide semiconductor device capable of use as a memory element. More particularly the invention concerns such a semiconductor device wherein a more heavily doped region of the same type as the substrate is provided under the channel of the normally depletion mode device, which region permits conversion of the device to an enhancement mode state whereby storage of information is possible therein.

2. Description of the Prior Art

With the development of a new type of semiconductor device referred to as a metal nitride oxide semiconductor it has been recognized that the MNOS device exhibits a capability of storing charge in the oxide nitride interface of the gate region thereby tending to vary the threshold voltage of the device. Consequently it has been recognized that such devices have utility for use as memory elements. One particular advantage of memory elements fabricated of MNOS devices is that they are extremely non-volatile. Consequently it is not necessary to continually refresh the information stored within the device.

For example, U.S. Pat. Nos. 3,549,911; 3,702,466; and 3,719,866 describe MNOS semiconductor devices utilized in various configurations as memory elements. These patents are believed to describe typical applications of MNOS devices in the art. However, it should be recognized that a continuing need exists for improved metal nitride oxide semiconductor devices which can be operated with relatively low voltages and which are simple to fabricate.

SUMMARY OF THE INVENTION

Accordingly, it is an object of the invention to provide an improved metal nitride oxide semiconductor device which can be operated with relatively low voltage levels.

It is another object of the invention to provide such a metal nitride oxide semiconductor device which can be utilized as a memory element, and which can be written and erased with the same polarity of voltage.

The aforementioned objects and other features and advantages of the invention are attained in the metal nitride oxide semiconductor device which is provided with a more heavily doped region of the same type as the substrate, directly under the channel of the normally depletion mode device. Application of a positive write voltage to the gate of the device with the substrate at substantially 0 volts potential and the source and drain biased to a suitable positive level results in avalanche operation of the device. Consequently, charge is stored in the nitride oxide interface located under the gate, thereby converting the device to enhancement mode operation. This results in the existence of different current flow conditions in the device when charge is stored and when charge is absent. The charge can be removed selectively with the source and drain biased to the 0 volt potential of the substrate and a positive erase signal applied to the gate of the semiconductor device. Accordingly, the device can be utilized in a memory cell as a memory element.

BRIEF DESCRIPTION OF THE DRAWINGS

Other features and advantages of the invention will become apparent from the following detailed description of the invention taken in conjunction with the accompanying drawings wherein.

DETAILED DESCRIPTION OF THE INVENTION

Figure 1:
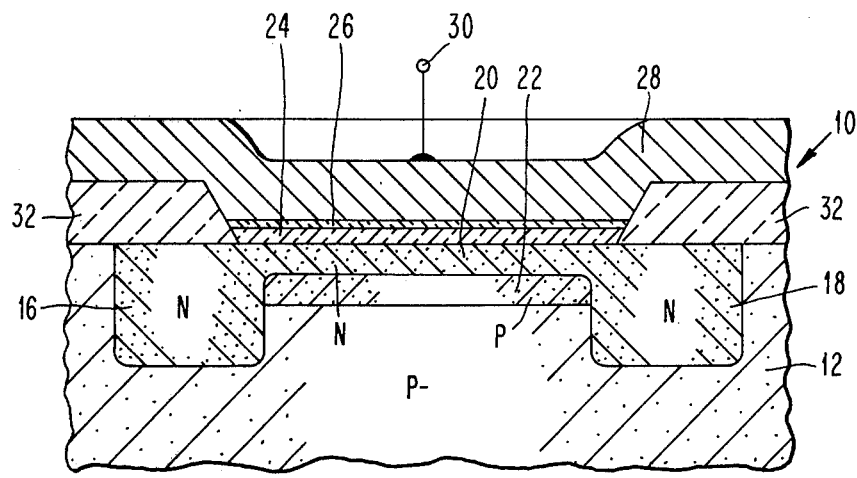
FIG. 1 is an illustration in cross section of one embodiment of an improved metal nitride oxide semiconductor device.

Referring now to the drawings, and particularly to FIG. 1, a preferred embodiment of an improved metal nitride oxide semiconductor device 10 is illustrated. Device 10 is formed within a P— silicon substrate 12 having a resistivity of about 15 ohms-centimeter for example. In the usual fashion, device 10 includes a pair of opposite conductivity regions 16, 18 formed within substrate 12 by conventional diffusion techniques. In the embodiment illustrated regions 16, 18 are formed on N material and are separated by a permanent channel 20 also formed of N material. Thus, it should be apparent that device 10 normally comprises a depletion mode device.

Beneath channel 20 a P region 22 is provided extending the full length of the channel. In fabricating layers 20 and 22 conventional ion implantation techniques are utilized. For example, at an appropriate stage in the fabrication of the device a boron implantation step is carried out with a fluence of $7.5 \times 10^{12}$ atoms-cm$^2$ and an energy of about 80 kev; followed by an arsenic implantation step carried out with a fluence of $1 \times 10^{13}$ atoms-cm$^2$ and an energy of about 100 kev, followed by the usual anneal step. It should be apparent that the bulk doping of the boron implantation creates a P resistivity in layer 22 and the following arsenic implantation over-dopes the region of layer 20 to form an N type region. In the preferred embodiment the implantation is carried out after fabrication of a gating structure described hereinafter, and prior to final metallization of the device. An oxide layer 24 is provided directly above substrate 12 extending over channel region 20 and slightly overlapping the drain and source regions 16, 18 as illustrated. In the embodiment illustrated layer 24 comprises silicon dioxide in a layer of about 75 angstroms thickness. Overlying layer 24 is a silicon nitride layer 26 having a preferred thickness of about 400 angstroms. In the usual fashion, the silicon oxide layer permits charge to flow therethrough and the nitride layer serves as a charge trapping material. Above the nitride layer there is a layer 28 of conductive material, such as aluminum, which serves as a gate electrode having an electrical terminal associated therewith in the usual fashion, such as terminal 30 schematically illustrated.

The gate region is bounded on either side by silicon dioxide layers 32 or other suitable insulating material. Drain and source regions of the device are otherwise adapted in the usual fashion to be electrically associated with suitable electrical biasing means by conventional electrodes, not illustrated.

As fabricated, the device illustrated in FIG. 1 is a depletion mode device with a strong response to substrate bias. Thus, if the substrate is biased to a 0 volt potential and the source and drain regions are biased to a level of 10 volts positive potential, then a positive signal of about 18 volts when applied to the gate, will cause avalanching to occur very close to the surface of the channel. Due to the selection of doping levels in layers 20 and 22, no avalanching will occur at any other portion of the junction. Consequently, hot electrons will tend to enter the oxide and be trapped in the nitride layer underlying the gate. The negative charge stored in the nitride layer across the full extent of channel 20 tends to convert the device to enhancement mode operation. Accordingly, an indication can be obtained from the device, due to its changed conduction characteristics, whether or not information has been written into the device and charge consequently stored therein. The information stored in the device can be erased by biasing the substrate as well as the source and drain regions to 0 potential and by applying a positive voltage of about 18 volts to the gate of the device. This tends to remove the electrons in the nitride layer and permit the device to assume depletion mode operation.

Reading is achieved by placing a −5 volt potential on the substrate, and a small positive voltage such as two to three volts on the gate, with the drain region biased to a low positive voltage such as 5 volts, and the source region biased to 0 volts. This creates a condition where enhancement mode devices are cut off but depletion mode devices conduct current.

Figure 2:
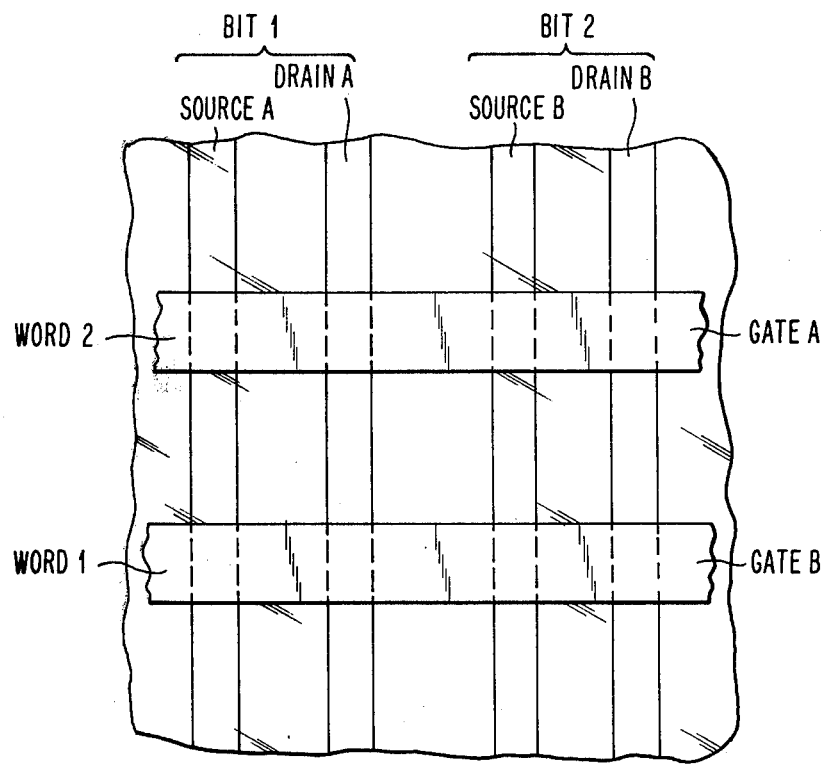
FIG. 2 is a schematic representation of a top view of a memory cell utilizing four devices such as that illustrated in FIG. 1.

The device illustrated in FIG. 1 can be utilized as a memory element in configurations such as that illustrated in FIG. 2. FIG. 2 represents a memory cell wherein four devices are arranged in a matrix configuration. Thus, a device exists where each word line crosses a source-drain pair. For example, a device is associated with source B and drain B where they are crossed by gate electrode A. In similar fashion a device is associated with source A and drain A where gate B crosses these elements in the lower length and portion of FIG. 2.

In operation, the entire array of FIG. 2 can be erased by connecting all source drain pairs to substrate potential, i.e. 0 voltage and by applying a positive voltage to all gate electrodes. This causes all devices within the array to assume depletion mode state.

Words are selectively written by making a given gate electrode or word line positive while all other gate electrode lines are connected to substrate potential. The devices for which the source-drain region is elevated in voltage to a predetermined level, such as about 10 volts positive, become enhancement mode devices due to the foregoing explanation of charge storage. It should be apparent that only a selected word would be affected, however.

To read a word from the array, the substrate is biased to a negative value. The selected gate electrode line is held at a value of bias such that enhancement mode devices are cut off, but the depletion mode devices conduct. The unselected gate electrode lines are held at 0 bias such that all devices on those lines are cut off. A bit sensing circuit is then utilized to discriminate between low and high conductivity states of the source-drain regions of each bit. Accordingly, the bit sensing circuit can determine which of the source-drain lines are conductive in a depletion state and which are cut off in the enhancement state. This in turn reveals the existence of a stored bit of information.

It should be apparent that the device illustrated provides an improved charge storage capability in metal nitride oxide semiconductor devices wherein long term retention of stored charge is achieved. Moreover, the device illustrated provides improved operation in that it enables faster writing and erasing of bit information than was heretofore possible with the use of positive voltage signals for both writing and erase operations.

What is claimed is:

1. A memory element comprising a conductive substrate of one conductivity type having first and second spaced apart regions of another conductivity forming a source and a drain for the element, respectively, said regions being interconnected by a thin region of said other conductivity type forming a channel between the source and drain;
   first and second insulating layers on the surface of said substrate overlying said channel and at least part of said source and drain regions to form a gate for said element, and
   a region of material of said one conductivity type provided in the substrate contiguous with said channel, said region having an active impurity concentration higher than that of said substrate and a resistivity lower than that of said substrate.

2. The memory element of claim 1 wherein said substrate is formed of P type material and wherein said source and drain regions are formed of N type material.

3. A memory element comprising a conductive substrate of one conductivity type having first and second spaced apart regions of another conductivity forming a source and a drain for the element, respectively, said regions being interconnected by a thin region of said other conductivity type forming a channel between the source and drain;
   insulation layer means formed on the surface of said substrate overlying said channel and at least part of said source and drain regions capable of storing charge, and
   a region of material of said one conductivity type provided in the substrate contiguous with said channel, said region having an active impurity concentration higher than that of said substrate and a resistivity lower than that of said substrate.

4. The memory element of claim 3 wherein said insulation mean forms part of the structure of a gate for said device.

5. A device including a conductive substrate of one conductivity type having spaced apart source and drain regions of another conductivity type formed therein, said source and drain regions being interconnected by a channel of said other conductivity type;
   gate means for storing charge formed upon the surface of said substrate overlying said channel; and
   a region of material of said one conductivity type extending beneath said channel, contiguous therewith, said region having an active impurity concentration higher than that of said substrate and a resistivity lower than that of said substrate.

* * * * *